US007103514B1

(12) United States Patent
Carlson et al.

(10) Patent No.: US 7,103,514 B1
(45) Date of Patent: Sep. 5, 2006

(54) FILTER TURNING POINT DETECTION

(75) Inventors: Scott M. Carlson, Tucson, AZ (US); Michel Henri Théodore Hack, Cortlandt Manor, NY (US); Li Zhang, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 11/223,730

(22) Filed: Sep. 9, 2005

(51) Int. Cl.
*G06F 15/00* (2006.01)

(52) U.S. Cl. .............. 702/189; 702/123; 702/125; 702/127; 714/707; 714/708; 714/712; 714/821

(58) Field of Classification Search .............. 702/189, 702/123, 125, 127; 717/707, 708, 712, 821; 713/503; 375/371
See application file for complete search history.

(56) References Cited

U.S. PATENT DOCUMENTS 6,661,810 B1   12/2003   Skelly et al.
2002/0120416 A1   8/2002   Liu et al.
2002/0176525 A1*   11/2002   Yamaguchi et al. ........ 375/371
2002/0188881 A1   12/2002   Liu et al.
2003/0031284 A1*   2/2003   Ishida et al. ................ 375/371

* cited by examiner

*Primary Examiner*—Marc S. Hoff
*Assistant Examiner*—Phuong Huynh
(74) *Attorney, Agent, or Firm*—Scully, Scott, Murphy & Presser; Eugene I. Shkurko, Esq.

(57) ABSTRACT

Disclosed are a method and system for detecting point. The method of this invention comprises the steps of providing a set of points representing measured time delays between two clocks, providing a turning indicator to measure a magnitude of turns per measurement interval, and identifying a turn at a given point when the turn indicator at said given point is above a given value. With the preferred embodiment of the invention, the turn indicator is given by the equation: turn_indicator=(rtt_min−rtt_estimate)/number_of_points; where rtt_min is the minimum round trip delay in all the measurement points, and rtt_estimate is estimated round trip delay by using the symmetric convex hull algorithm.

16 Claims, 4 Drawing Sheets rtt_min IS THE MINIMUM ROUND TRIP DELAY IN ALL THE MEASUREMENT POINTS rtt_estimate IS THE ESTIMATED ROUND TRIP DELAY BY USING THE SYMMETRIC CONVEX HULL ALGORITHM rtt_min IS THE MINIMUM ROUND TRIP DELAY IN ALL THE MEASUREMENT POINTS rtt_estimate IS THE ESTIMATED ROUND TRIP DELAY BY USING
THE SYMMETRIC CONVEX HULL ALGORITHM

FILTER TURNING POINT DETECTION

CROSS REFERENCE TO RELATED APPLICATIONS

This application is related to copending application Ser. No. 11/223,878 for "Clock Filter Dispersion," filed herewith; application Ser. No. 11/223,876, for "Method And System For Clock Skew And Offset Estimation," filed herewith; and application Ser. No. 11/223,577 for "Use of T4 Timestamps To Calculate Clock Offset And Skew," filed herewith. The disclosures of the above-identified applications are herein incorporated by reference in their entireties.

BACKGROUND OF THE INVENTION

1. Field of the Invention

This invention generally relates to computer systems, and in particular to time synchronization in computer systems. Even more specifically, the invention relates to methods and systems for calculating clock offset and skew between two clocks in a computer system.

2. Background Art

Modern computers use clocks for many purposes, including ensuring that many operations occur in the proper sequence or in synchronization. Because of this, it is important that the clocks themselves operate in close synchronization. Typically, two clocks are often not in perfect synchronization, and there are timing differences between the clocks. In addition, two clocks may not operate at the exact same frequency, so that the timing difference between the clocks changes over time. This change in the timing difference between the clocks is referred to as the clock skew.

Many computer timing protocols require information such as the estimation of the skew and offset between two clocks. These two clocks may be, for example, a local clock and its source clock. For example, the Server Timing Protocol (STP) requires the estimation of the skew and offset between the local clock and the clock source. The accuracy of the estimation is crucial for the synchronization accuracy of the protocol. While methods and systems to measure clock skew are known, these known procedures tend to be quite complex, unreliable in certain situations, or both.

Moreover, estimating clock skew and offset can be complicated by turning points in the time delay data. Because of this, turning point detection is crucial in the mixed CTN environment, when, for example ETR (9037) is the clock server. As ETR can change its steering rate by 25 ppm without informing anyone, the synchronization algorithm needs to quickly detect such turns. Any delay in the detection can result in the loss of tens of microseconds in accuracy.

SUMMARY OF THE INVENTION

An object of this invention is to improve the accuracy of the estimation of the clock skew and offset between two clocks in a computer system.

Another object of the present invention is to provide a turning point identification algorithm to quickly detect changes in the steering rate at a clock source.

These and other objectives are attained with a method and system for detecting a turning point in a sequence of points. Generally, the present invention uses a turning point detection algorithm that is based on the convex hull algorithm and, in addition, uses an indicator to differentiate the turns from the observed noise. More specifically, the method of this invention comprises the steps of plotting a first set of points; and plotting a second set of points, wherein said plots form a channel therebetween. The method comprises the further step of using a turn indicator to identify any turning points in said channel. Preferably, the step of using the turn indicator includes the steps of using the turn indicator to measure a magnitude of turn per measurement interval, and identifying a turn at a given point in said channel when the turn indicator at said given point is above a given value.

With the preferred embodiment of the invention, the turn indicator is given by the equation:

$$\text{turn\_indicator} = (\text{rtt\_min} - \text{rtt\_estimate}) / \text{number\_of\_points};$$

where rtt_min is the minimum round trip delay in all the measurement points, and rtt_estimate is estimated round trip delay by using the symmetric convex hull algorithm.

Also, preferably, the turn at a given point is identified as a turning point if at that point:

$$\text{turn\_indicator} <= \text{rtt\_std};$$

where, rtt_std is the standard deviation of the round trip delays for all the measurement points.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
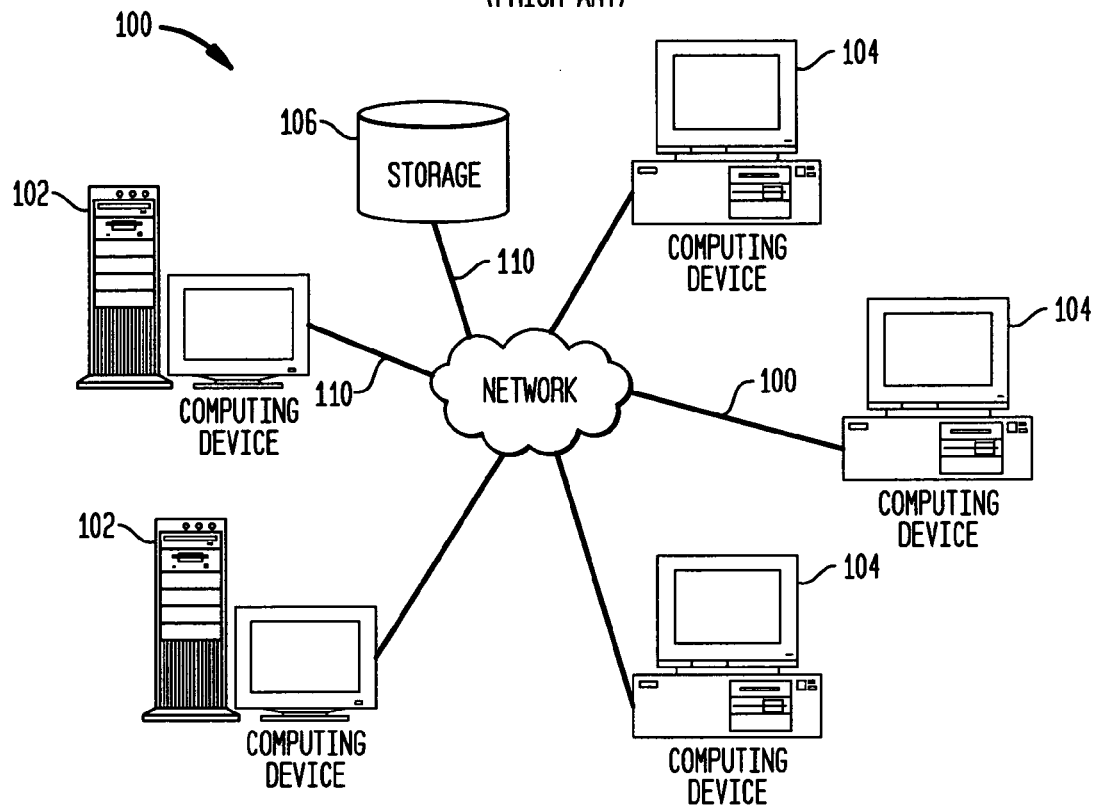
FIG. 1 illustrates a network of data processing systems in which the present invention may be implemented.

FIG. 1 illustrates a computer network 100, including servers 102, clients 104 and data storage unit 106. Network 100 also includes data connections 110 for transmitting data between the devices of the network. Network 100 may be, for example, the Internet, but could also be an intranet, a local are network a wide area network, point-to-point links, or other networks.

Any suitable servers 102 may be used in the network 100. Also, the clients 104 of network 100 may be, for example, personal computers, laptop computers, servers, workstations, main frame computers, or other devices capable of communicating over the network. Similarly, connectors 110 may comprise a wide range of suitable devices, such as wire, fiber optics or wireless communication links.

As mentioned above, various computer timing protocols, including the Server Timing Protocol (STP), require calculating the skew and offset between two clocks in computer systems or networks, such as network 100. Calculating or estimating these values can be complicated by turning points in the data used to calculate or estimate the values. The present invention provides an improved procedure for identifying those turning points.

Figure 2:
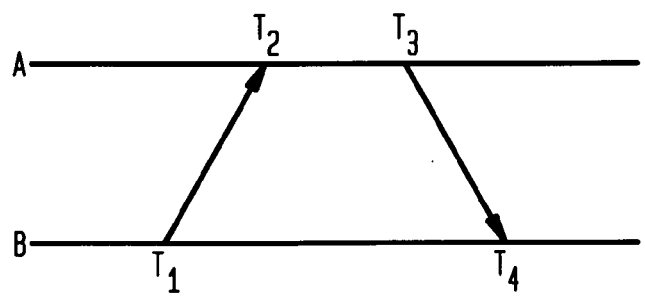
FIG. 2 illustrates a packet exchange between a clock machine B and a clock server A in the network of FIG. 1.

Reference is first made to FIG. 2, which illustrates a packet exchange between a local machine B and a clock server A. The packet leaves B at time T1, according to B's clock. The packet arrives at A at time T2, according to A's clock. Machine A then sends a reply packet at time T3, according to A's clock. The reply message reaches B at time T4, according to B's clock. By sending out this kind of exchange message regularly and recording the sequence of T1, T2, T3, T4 timestamps, one can obtain estimates of the relative offset and speed difference between the clock of machine B and the clock of machine A.

Procedures are known that compute a sequence of forward and backward delays, (FD and BD) from the sequence of T1, T2, T3, T4 timestamps. For example, such procedures are described in U.S. patent application Ser. Nos. 09/920,138 and 10/157,610 and in U.S. Pat. No. 6,661,810. In particular, $$FD=T2-T1, BD=T4-T3.$$

Let's use $T1(i)$, $T2(i)$, $T3(i)$, $T4(i)$, $FD(i)$ and $BD(i)$ to denote the timestamps and delays for the $i^{th}$ packet exchange. Prior arts constructs two sets of delay points in the two dimensional plane, $\{(T1(i), FD(i)) | i=1, \ldots\}$ and $\{(T1(i), BD(i)) | i=1, \ldots\}$. U.S. Pat. No. 6,661,810 considers the two sets of points independently, which may not yield accurate results as the present invention. U.S. patent application Ser. Nos. 09/920,138 and 10/157,610 consider the two sets of delay points jointly, which yield better accuracy than U.S. Pat. No. 6,661,810.

In the Server Timing Protocol (STP) environment, for example, it is possible that a remote server changes its steering rate without informing all the machines who are using it as a time source. For example, when ETR is used as a stratum 1 server, it can change its steering rate by as much as 25 PPM without notifying the other machines. When there is a sudden change in steering rate at the clock source, normal estimation algorithms may not be able to recognize this steering effect right away. It can take some time for the normal algorithms to realize the change in steering and correct for it. The present invention provides a turning point identification algorithm to quickly detect this change in steering rate within the filter points. For noisy delay channels, it can be difficult to distinguish the turn due to noisy data from the real turns. This is exactly where the challenge lies for this kind of identification algorithms.

General change point detection algorithms in statistics can be used to detect changes in the statistical behaviors for time series. However, such algorithms can take a long time in detecting the turning points, due to the continuous nature of the delay points. In patent application Ser. No. 10/157,610, two algorithms are presented to detect the jumps and turning points in the delay traces. However, these two algorithms do not take the delay characteristics into account. In particular, the noise levels in the delay traces have no significant impact in the detection of the turning points.

In accordance with the present invention, another heuristic algorithm is used in STP to identify the turning points in the delay filters. This invention defines a turn_indicator to measure the magnitude of the turn per measurement interval. If this magnitude is larger than the intrinsic noise in the delay data, then the turning amount is more likely to be due to a real turn, rather than due to the random noise. Specifically, the variables are defined below:

$$\text{turn\_indicator} = (\text{rtt\_min} - \text{rtt\_estimate}) / \text{number\_of\_points};$$

$$\text{valid\_solution} = \text{TRUE if (turn\_indicator} <= \text{rtt\_std});$$

Figure 3:
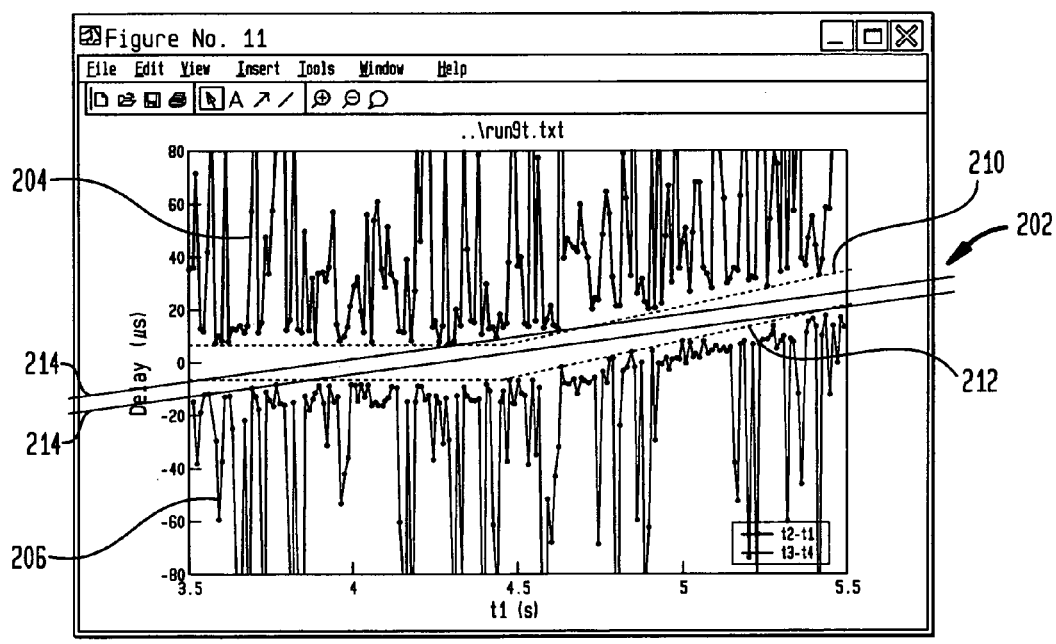
FIG. 3 illustrates forward and backward delay lines.

Here rtt_min is the minimum round trip delay in all the measurement points. rtt_estimate is estimated round trip delay by using the symmetric convex hull algorithm. rtt_std is the standard deviation of the round trip delays for all the measurement points. One can look at FIG. 3 and imagine a flexible pipe 202 between the forward and negative backward delay lines 204 and 206. More specifically, in FIG. 3, line 204 represents the forward delay sequence, and line 206 represents backward delay sequence. Dashed lines 210 and 212 represent remote clock turning (flexible pipe). Width=round_trip_delay (measurement). Lines 214 show the result of the algorithm without turning point detection. Width=round_trip_delay (estimated). The flexible pipe may turn from time to time. rtt_min corresponds to the narrowest point of the pipe. rtt_estimate is the diameter of a straight pipe between the delay lines. In the event of no turning points, the difference between rtt_min and rtt_estimate is small. When there is a turning point, the difference divided by the number of points corresponds to the deviation per measurement interval. If this deviation is larger than the intrinsic noise level, which is the standard deviation of the round trip delays, then the deviation is likely to be from a real turn than from just noise.

Figure 4:
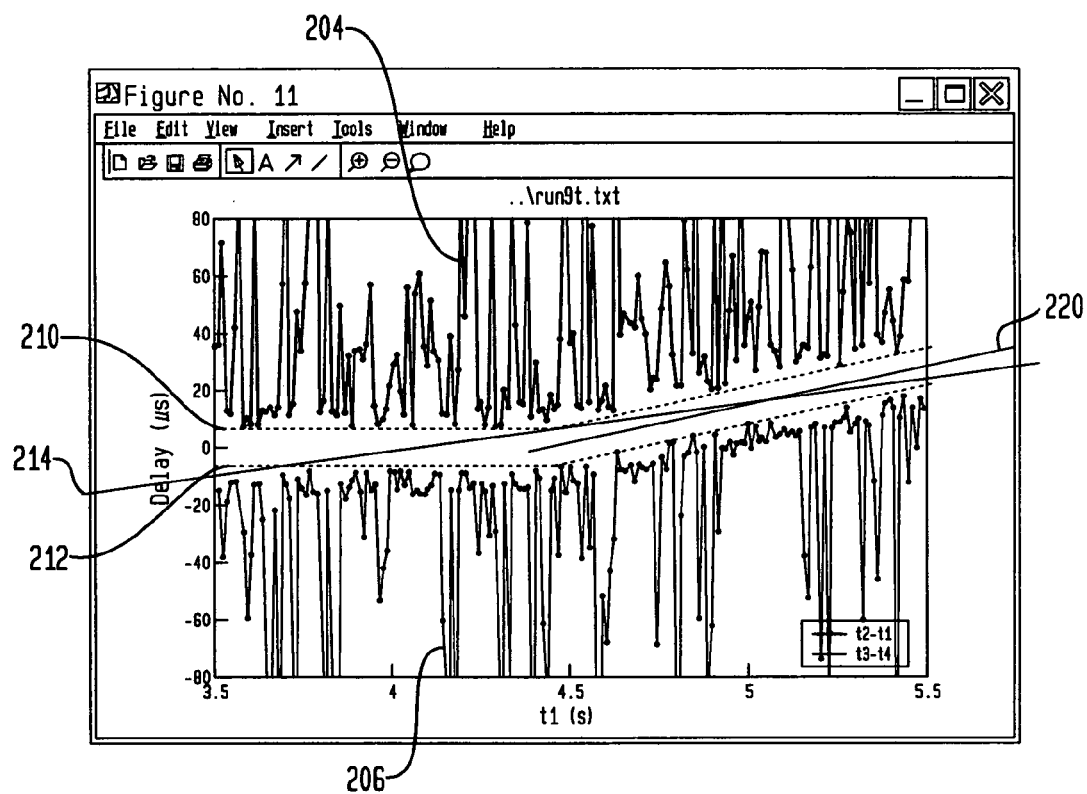
FIG. 4 shows an example of a turning point detection algorithm in accordance with the present invention.

After a turning point in the measurement points is detected, the turning point is assumed to be the vertex computed from the symmetric convex hull algorithm. The symmetric convex hull algorithm is run again for the measurement data after the turning point and the identification process is repeated. The process stops if a turning point is not detected, or when there are only two points left. FIG. 4 illustrates an example of this turning point detection algorithm. In particular, in FIG. 4, line 204 represents the forward delay sequence, and line 206 represents the backward delay sequence. Line 220 represents estimated clock behavior with turning point detection (more accurate representation of true clock behavior). Through extensive experiments, it has been observed that this turning point identification is quite accurate. It finds the turning points very quickly, even in the event of quite noisy data. By using this algorithm, the present invention significantly improves the accuracy of the clock offset and skew estimations.

Presented below is a formal description of the algorithm:
1) set valid_solution=FALSE
2) while (valid_solution=FALSE)
   a. run the symmetric convex hull algorithm
   b. turn_indicator=(rtt_min−rtt_estimate)/number_of_points
   c. if (turn_indicator <=rtt_std) or (number_of_points<=2), then valid_solution=TRUE
      else, set starting_point equal to vertex identified by the symmetric convex hull algorithm
3) return the best offset, clock skew estimate.

Figure 5:
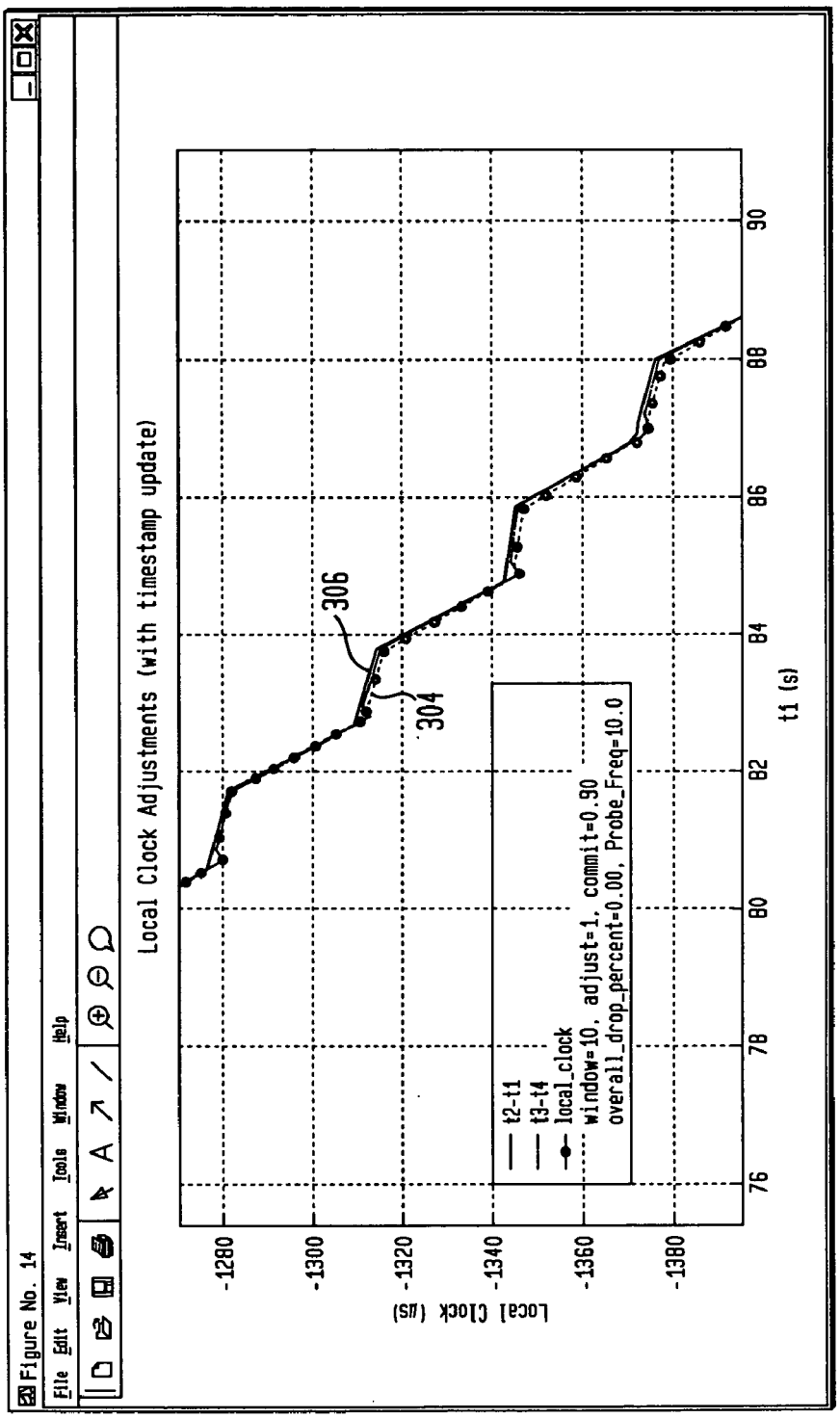
FIG. 5 shows the results of applying the turning point identification algorithm to local clock correction.

FIG. 5 shows an example of the turning point identification algorithm. With the example shown in FIG. 5, only one point goes outside of the band between lines 304 and 306. This means that it takes one observation to recognize the turning point and another point to adjust the local clock within range.

As will be readily apparent to those skilled in the art, the present invention can be realized in hardware, software, or a combination of hardware and software. Any kind of computer/server system(s)—or other apparatus adapted for carrying out the methods described herein—is suited. A typical combination of hardware and software could be a general purpose computer system with a computer program that, when loaded and executed, carries out the respective methods described herein. Alternatively, a specific use computer, containing specialized hardware for carrying out one or more of the functional tasks of the invention, could be utilized.

The present invention can also be embedded in a computer program product, which comprises all the respective features enabling the implementation of the methods described herein, and which—when loaded in a computer system—is able to carry out these methods. Computer program, software program, program, or software, in the present context mean any expression, in any language, code or notation, of a set of instructions intended to cause a system having an information processing capability to perform a particular function either directly or after either or both of the following: (a) conversion to another language, code or notation; and/or (b) reproduction in a different material form.

While it is apparent that the invention herein disclosed is well calculated to fulfill the objects stated above, it will be appreciated that numerous modifications and embodiments may be devised by those skilled in the art and it is intended that the appended claims cover all such modifications and embodiments as fall within the true spirit and scope of the present invention.

What is claimed is:

1. A method for detecting a turning point in a sequence of points, comprising the steps of:
    plotting a first set of points;
    plotting a second set of points, wherein said plots form a channel therebetween; and
    using a turn indicator to identify any turning points in said channel, including the steps of:
        i) using the turn indicator to measure a magnitude of turn per measurement interval, and
        ii) identifying a turn at a given point in said channel based on the magnitude of the turn indicator at said given point.

2. A method according to claim 1, wherein the step of identifying a turn at a given point includes the step of:
    identifying a turn at a given point in said channel when the turn indicator at said given point is above a given value.

3. A method according to claim 2, wherein said turn indicator is given by the equation:

$$\text{turn\_indicator} = (rtt\_\text{min} - rtt\_\text{estimate})/\text{number\_of\_points};$$

where $rtt\_min$ is the minimum round trip delay in all the measurement points, and
    $rtt\_estimate$ is estimated round trip delay by using the symmetric convex hull algorithm.

4. A method according to claim 3, wherein the turn at said given point is identified as a turning point if at said given point:

$$\text{turn\_indicator} <= rtt\_\text{std};$$

where, $rtt\_std$ is the standard deviation of the round trip delays for all the measurement points.

5. A method according to claim 4, wherein the turn indicator is determined at each point in said sequence.

6. A method according to claim 5, wherein said first set of points represent measurements of the forward time delay and said second set of points represent negative backward time delay between said two clocks.

7. A system for detecting a turning point in a sequence of points, comprising:
    a first set of plotted points;
    a second set of plotted points, wherein said first and second sets of plotted points form a channel therebetween; and
    a turn indicator to identify any turning points in said channel; and
    wherein said first set of points represent measurements of the forward time delay and the second set of points represent the negative backward time delay between said two clocks.

8. A system according to claim 7, wherein the turn indicator includes:
    means to measure a magnitude of turn per measurement interval; and
    means for identifying a turn at a given point in said channel when the turn indicator at said given point is above a given value.

9. A system according to claim 8, wherein said turn indicator is given by the equation:

$$\text{turn\_indicator} = (rtt\_\text{min} - rtt\_\text{estimate})/\text{number\_of\_points};$$

where $rtt\_min$ is the minimum round trip delay in all the measurement points, and
    $rtt\_estimate$ is estimated round trip delay by using the symmetric convex hull algorithm.

10. A system according to claim 9, wherein the turn at said given point is identified as a turning point if at said given point:

$$\text{turn\_indicator} <= rtt\_\text{std});$$

where, $rtt\_std$ is the standard deviation of the round trip delays for all the measurement points.

11. A system according to claim 10, wherein the turn indicator is determined at each point in said sequence.

12. A program storage device readable by machine, tangibly embodying a program of instructions executable by the machine to perform method steps for detecting a turning point in a sequence of points, said method steps comprising:
    plotting a first set of points;
    plotting a second set of points, wherein said plots form a channel therebetween; and
    using a turn indicator to identify any turning points in said channel; and
    wherein the step of using the turn indicator includes the steps of:
    using the turn indicator to measure a magnitude of turn per measurement interval; and
    identifying a turn at a given point in said channel when the turn indicator at said given point is above a given value.

13. A program storage device according to claim 12, wherein said turn indicator is given by the equation:

$$\text{turn\_indicator} = (rtt\_\text{min} - rtt\_\text{estimate})/\text{number\_of\_points};$$

where $rtt\_min$ is the minimum round trip delay in all the measurement points, and rtt_estimate is estimated round trip delay by using the symmetric convex hull algorithm.

14. A program storage device according to claim 13, wherein the turn at said given point is identified as a turning point if at said given point:

turn_indicator<=rtt_std);

where, rtt_std is the standard deviation of the round trip delays for all the measurement points.

15. A program storage device according to claim 14, wherein the turn indicator is determined at each point is said sequence.

16. A program storage device according to claim 15, wherein said first set of points represent measurements of the forward time delay and the second set of points represent the negative backward time delay between said two clocks.

* * * * *